United States Patent
Punzalan et al.

(10) Patent No.: US 8,003,443 B2
(45) Date of Patent: Aug. 23, 2011

(54) NON-LEADED INTEGRATED CIRCUIT PACKAGE SYSTEM WITH MULTIPLE GROUND SITES

(75) Inventors: Jeffrey D. Punzalan, Singapore (SG); Byung Tai Do, Singapore (SG); Henry D. Bathan, Singapore (SG); Zigmund Ramirez Camacho, Singapore (SG)

(73) Assignee: Stats Chippac Ltd., Singapore (SG)

( * ) Notice: Subject to any disclaimer, the term of this patent is extended or adjusted under 35 U.S.C. 154(b) by 941 days.

(21) Appl. No.: 11/276,684

(22) Filed: Mar. 10, 2006

(65) Prior Publication Data

US 2007/0212903 A1   Sep. 13, 2007

(51) Int. Cl.
*H01L 23/495* (2006.01)
(52) U.S. Cl. .............. 438/123; 257/E23.037
(58) Field of Classification Search .......... 257/666, 257/777, 692, 123, E23.037; 438/123
See application file for complete search history.

(56) References Cited

U.S. PATENT DOCUMENTS

| | | | |
|---|---|---|---|
| 5,475,606 A * | 12/1995 | Muyshondt et al. | 716/19 |
| 6,515,861 B1 * | 2/2003 | Andric et al. | 361/709 |
| 6,661,083 B2 | 12/2003 | Lee et al. | |
| 6,717,824 B2 * | 4/2004 | Miyajima et al. | 361/803 |
| 6,833,609 B1 | 12/2004 | Fusaro et al. | |
| 6,838,751 B2 | 1/2005 | Cheng et al. | |
| 6,867,071 B1 | 3/2005 | Lee et al. | |
| 6,867,072 B1 | 3/2005 | Shiu et al. | |
| 6,876,068 B1 | 4/2005 | Lee et al. | |
| 6,876,069 B2 | 4/2005 | Punzalan et al. | |
| 6,882,037 B2 | 4/2005 | Lin et al. | |
| 6,903,448 B1 * | 6/2005 | Sutardja et al. | 257/666 |
| 6,917,097 B2 | 7/2005 | Chow et al. | |
| 6,965,157 B1 | 11/2005 | Perez et al. | |
| 6,995,459 B2 | 2/2006 | Lee et al. | |
| 7,211,887 B2 | 5/2007 | Channabasa et al. | |
| 2003/0127711 A1 * | 7/2003 | Kawai et al. | 257/666 |
| 2004/0238921 A1 | 12/2004 | Lee et al. | |
| 2005/0006735 A1 * | 1/2005 | an Tatt et al. | 257/676 |
| 2005/0236701 A1 | 10/2005 | Minamio et al. | |
| 2006/0006510 A1 | 1/2006 | Koduri | |
| 2006/0033184 A1 * | 2/2006 | Park et al. | 257/666 |
| 2007/0114650 A1 | 5/2007 | Punzalan et al. | |

OTHER PUBLICATIONS

Merriam-Webster's Collegiate Dictionary, Tenth Edition, Merriam-Webster, Inc, Springfield, MA, 2001; p. 473.

* cited by examiner

*Primary Examiner* — Thomas L Dickey
*Assistant Examiner* — Selim Ahmed
(74) *Attorney, Agent, or Firm* — Mikio Ishimaru

(57) ABSTRACT

A non-leaded integrated circuit package system is provided providing a die paddle of a lead frame, forming a dual row of terminals including an outer terminal and an inner terminal, and selectively fusing an inner terminal and an adjacent inner terminal to form a fused lead.

10 Claims, 9 Drawing Sheets

NON-LEADED INTEGRATED CIRCUIT PACKAGE SYSTEM WITH MULTIPLE GROUND SITES

CROSS-REFERENCE TO RELATED APPLICATION(S)

The present application contains subject matter related to a co-pending U.S. patent application Ser. No. 11/164,335 entitled "Non-leaded Integrated Circuit Package System". The related application is assigned to STATS ChipPAC Ltd. The subject matter thereof in its entirety is hereby incorporated by reference thereto.

TECHNICAL FIELD

The present invention relates generally to integrated circuit packages and more particularly to ground planes of integrated circuit packages.

BACKGROUND ART

Modern consumer electronics, such as cellular phones, digital cameras, and music players, are packing more integrated circuits into an ever shrinking physical space with expectations for decreasing cost. Numerous technologies have been developed to meet these requirements. Some of the research and development strategies focus on new package technologies while others focus on improving the existing and mature package technologies. Research and development in the existing package technologies may take a myriad of different directions.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments. Paradoxically, the reuse of existing manufacturing processes does not typically result in the reduction of package dimensions. As the integrated circuit content increases in a package, the input and output density increases. The input and output density increase also creates challenges for the printed circuit board. The design of the printed circuit board increases in complexity and congestion resulting from the increase in the input and output density of the package.

Thus, a need still remains for a non-leaded integrated circuit package system supporting higher input and output pin count while alleviating the demands on the printed circuit board designs. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a non-leaded integrated circuit package system including providing a die paddle of a lead frame, forming a dual row of terminals including an outer terminal and an inner terminal, and selectively fusing an inner terminal and an adjacent inner terminal to form a fused lead.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
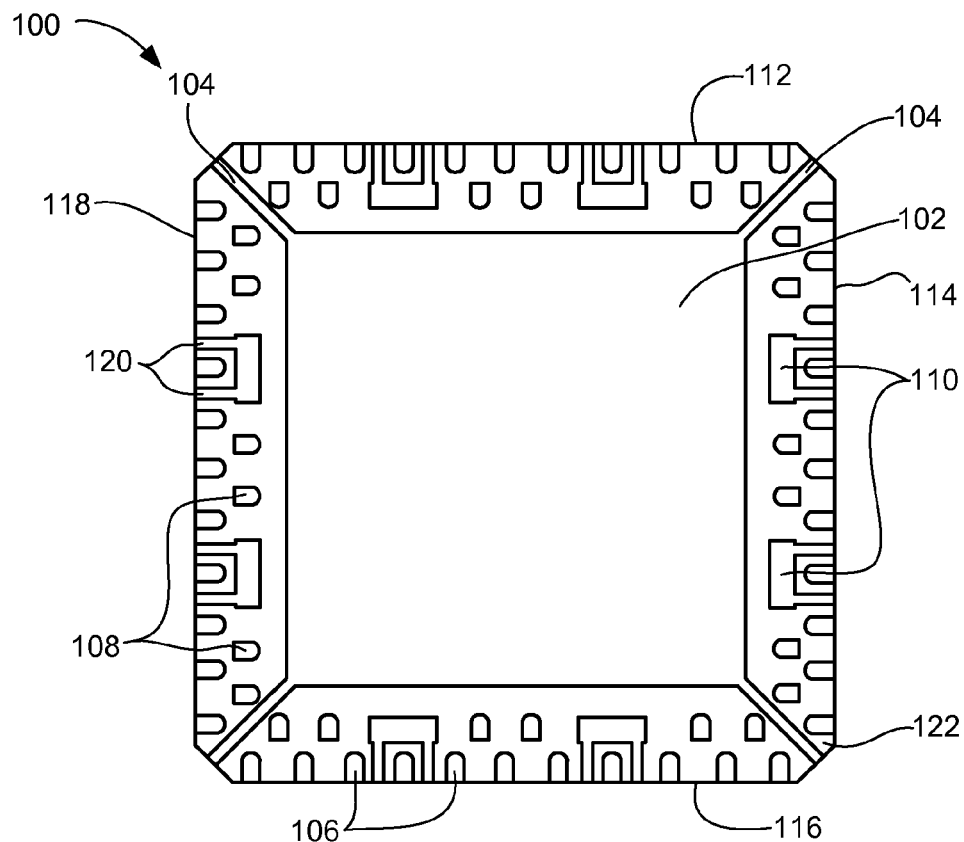
FIG. 1 is a plan view of a non-leaded integrated circuit package system in an embodiment of the present invention.

In the following description, numerous specific details are given to provide a thorough understanding of the invention.

However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material, patterning, exposure, development, etching, cleaning, molding, and/or removal of the material or as required in forming a described structure.

Referring now to FIG. 1, therein is shown a plan view of a non-leaded integrated circuit package system 100 in an embodiment of the present invention. The non-leaded integrated circuit package system 100 includes a die paddle 102 connected to tie bars 104. The die paddle 102 is within a dual row of terminal pads with an outer row having outer terminals 106 and an inner row having inner terminals 108. The outer terminals 106 and the inner terminals 108 are in a staggered configuration.

The non-leaded integrated circuit package system 100 also includes first fused leads 110, such as two of the inner terminals 108 depopulated and fused, providing ground bonding pads for an integrated circuit die (not shown) attached to the die paddle 102. The first fused leads 110 have a fused shape including regions of at least two of the inner terminals 108 and regions between facing sides of the at least two of the inner terminals 108. The first fused leads 110 in a row are isoiated from at least another of the inner terminals 108 in the row. The first fused leads 110 may be formed by a number of processes, such as etching the lead frame to fuse the leads configured by lead frame artwork design.

The first fused leads 110 surround the inner terminals 108 not fused as well as surrounded by the inner terminals 108 not fused. The first fused leads 110 are formed along a first side 112, a second side 114, a third side 116, and a fourth side 118 and have extensions 120 extending to the edges of the non-leaded integrated circuit package system 100 and surrounding one of the outer terminals 106. For illustrative purpose, the first fused leads 110 are shown as depopulating two of the inner terminals 108, although it is understood the number of the inner terminals 108 depopulated may differ, as well.

The first fused leads 110 provide additional flexibility for ground traces (not shown) of a printed circuit board (not shown) to provide ground connection to the non-leaded integrated circuit package system 100 reducing the routing congestion of the printed circuit board. The additional routing flexibility alleviates the need to use a larger pin count, larger footprint package allowing the non-leaded integrated circuit package system 100 to be as small a footprint as possible.

The extensions 120 may provide ground shielding to the one of the outer terminals 106 surrounded by the extensions 120 without using the outer terminals 106 for the ground shielding and alleviating the need to route ground traces of the printed circuit for the ground shielding. The extensions 120 enable maximum use of the outer terminals 106 for non-ground functions resulting in a smaller package footprint.

An encapsulant 122 surrounds the die paddle 102, the tie bars 104, the outer terminals 106, the inner terminals 108, the first fused leads 110, and the extensions 120. The outer terminals 106 and the inner terminals 108 are exposed for connections to the next system level (not shown), such as the printed circuit board. The die paddle 102 may be exposed for connection to the next system level. The first fused leads 110 may be exposed for connections to the next system level. The extensions 120 may be exposed for connections to the next system level.

Figure 2:
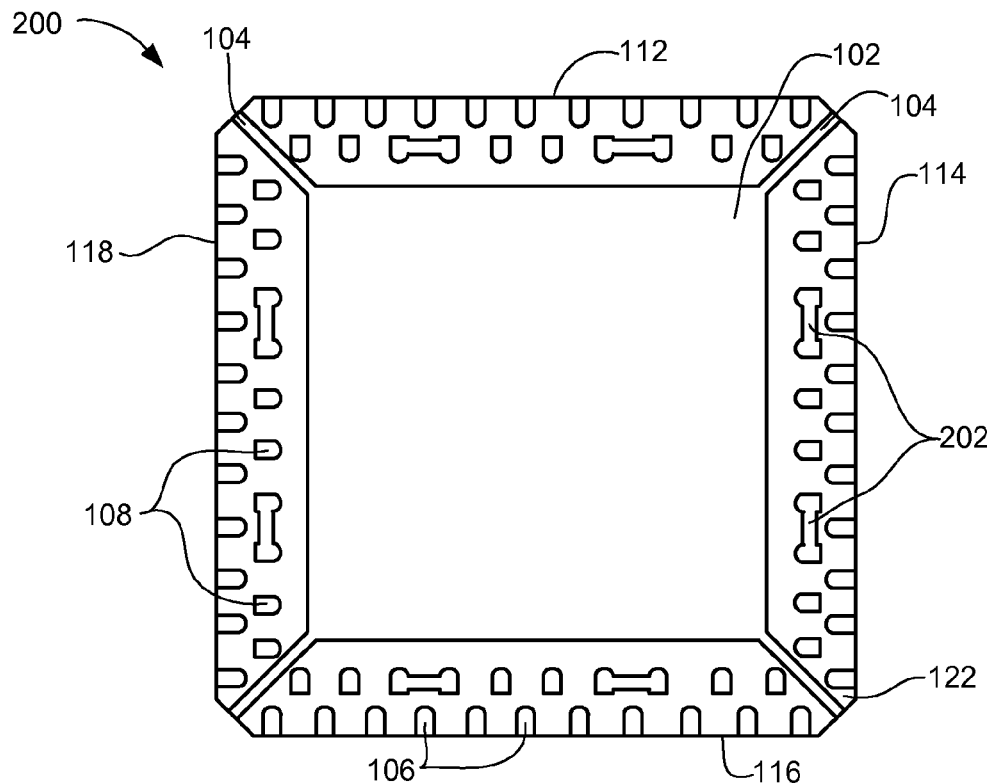
FIG. 2 is a plan view of a non-leaded integrated circuit package system in an alternative embodiment of the present invention.

Referring now to FIG. 2, therein is shown a plan view of a non-leaded integrated circuit package system 200 in an alternative embodiment of the present invention. The non-leaded integrated circuit package system 200 includes the die paddle 102 connected to the tie bars 104. The die paddle 102 is within the dual row of the terminals pads with the outer row having the outer terminals 106 and the inner row having the inner terminals 108. The outer terminals 106 and the inner terminals 108 are in a staggered configuration.

The non-leaded integrated circuit package system 200 also includes first fused leads 202, such as two of the inner terminals 108 depopulated and fused, providing ground bonding pads for an integrated circuit die (not shown) attached to the die paddle 102. The first fused leads 202 surround the inner terminals 108 not fused as well as surrounded by the inner terminals 108 not fused. The first fused leads 202 are formed along the first side 112, the second side 114, the third side 116, and the fourth side 118. For illustrative purpose, the first fused leads 202 are shown as depopulating two of the inner terminals 108, although it is understood the number of the inner terminals 108 depopulated may differ, as well.

The first fused leads 202 provide additional flexibility for ground traces (not shown) of a printed circuit board (not shown) to provide ground connection to the non-leaded integrated circuit package system 200 reducing the routing congestion of the printed circuit board. The additional routing flexibility alleviates the need to use a larger pin count, larger footprint package allowing the non-leaded integrated circuit package system 200 to be as small a footprint as possible.

The encapsulant 122 surrounds the die paddle 102, the tie bars 104, the outer terminals 106, the inner terminals 108, and the first fused leads 202. The outer terminals 106 and the inner terminals 108 are exposed for connections to the next system level (not shown), such as the printed circuit board. The die paddle 102 may be exposed for connection to the next system level. The first fused leads 202 may be exposed for connections to the next system level.

Figure 3:
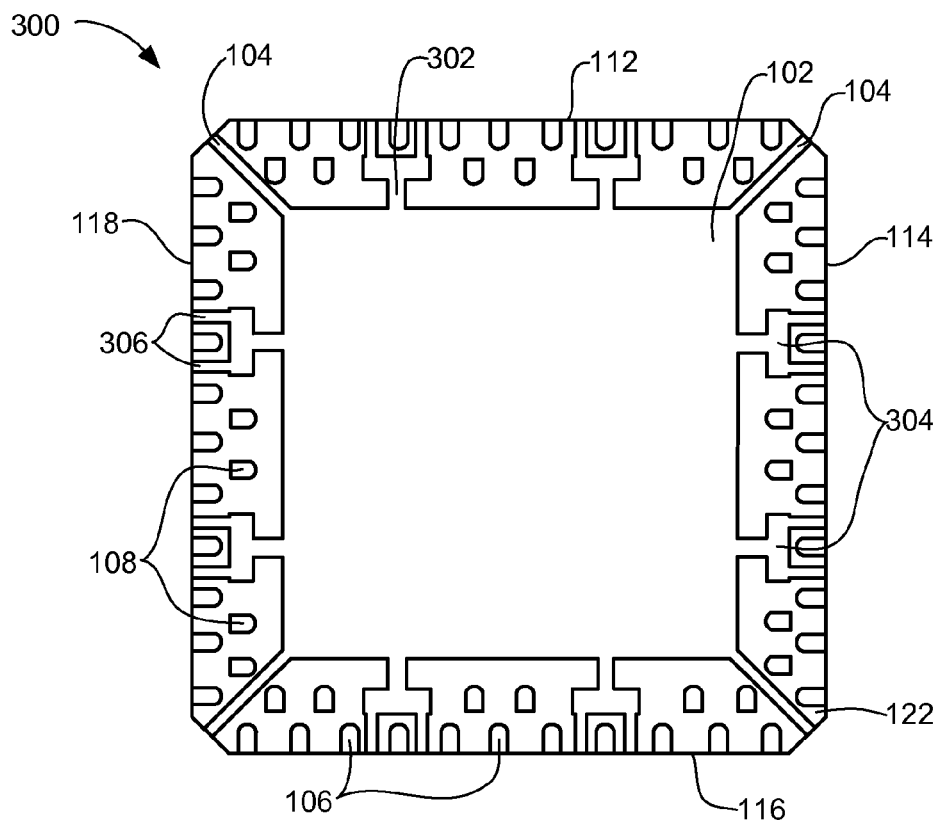
FIG. 3 is a plan view of a non-leaded integrated circuit package system in another alternative embodiment of the present invention.

Referring now to FIG. 3, therein is shown a plan view of a non-leaded integrated circuit package system 300 in another alternative embodiment of the present invention. The non-leaded integrated circuit package system 300 includes the die paddle 102 connected to the tie bars 104, and paddle interconnects 302. The die paddle 102 is within the dual row of the terminals pads with the outer row having the outer terminals 106 and the inner row having the inner terminals 108. The outer terminals 106 and the inner terminals 108 are in a staggered configuration.

The non-leaded integrated circuit package system 300 also includes first fused leads 304, such as two of the inner terminals 108 depopulated and fused, providing ground bonding pads for an integrated circuit die (not shown) attached to the die paddle 102. The first fused leads 304 surround the inner terminals 108 not fused as well as surrounded by the inner terminals 108 not fused. The first fused leads 304 are formed along the first side 112, the second side 114, the third side 116, and the fourth side 118 and have extensions 306 extending to the edges of the non-leaded integrated circuit package system 300 and surrounding one of the outer terminals 106. For illustrative purpose, the first fused leads 304 are shown as depopulating two of the inner terminals 108, although it is understood the number of the inner terminals 108 depopulated may differ, as well.

The first fused leads 304 provide additional flexibility for ground traces (not shown) of a printed circuit board (not shown) to provide ground connection to the non-leaded integrated circuit package system 300 reducing the routing congestion of the printed circuit board. The additional routing flexibility alleviates the need to use a larger pin count, larger footprint package allowing the non-leaded integrated circuit package system 300 to be as small a footprint as possible.

The extensions 306 may provide ground shielding to the one of the outer terminals 106 surrounded by the extensions 306 without using the outer terminals 106 for the ground shielding and alleviating the need to route ground traces of the printed circuit for the ground shielding. The extensions 306 enable maximum use of the outer terminals 106 for non-ground functions resulting in a smaller package footprint.

Each of the first fused leads 304 have one of the paddle interconnects 302 connecting the first fused leads 304 to the die paddle 102. The paddle interconnects 302 provide additional routing flexibility for the printed circuit board design by providing the option for ground to be connected to the die paddle 102 for the ground connection to the first fused leads 304 and the extensions 306. The paddle interconnects 302 also enable a smaller package footprint.

The encapsulant 122 surrounds the die paddle 102, the tie bars 104, the outer terminals 106, the inner terminals 108, the first fused leads 304, the extensions 306, and the paddle interconnects 302. The outer terminals 106 and the inner terminals 108 are exposed for connections to the next system level (not shown), such as the printed circuit board. The die paddle 102 may be exposed for connection to the next system level. The first fused leads 304 may be exposed for connections to the next system level. The extensions 306 may be exposed for connections to the next system level. The paddle interconnects 302 may be exposed for connections to the next system level.

Figure 4:
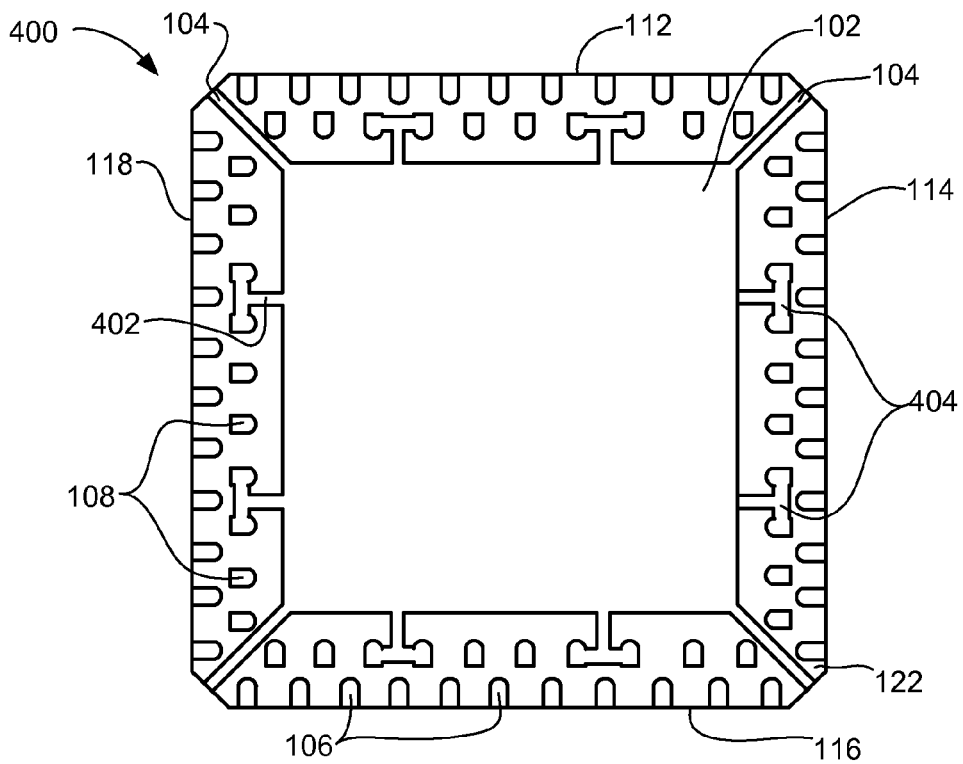
FIG. 4 is a plan view of a non-leaded integrated circuit package system in yet another alternative embodiment of the present invention.

Referring now to FIG. 4, therein is shown a plan view of a non-leaded integrated circuit package system 400 in yet another alternative embodiment of the present invention. The non-leaded integrated circuit package system 400 includes the die paddle 102 connected to the tie bars 104, and paddle interconnects 402. The die paddle 102 is within the dual row of the terminals pads with the outer row having the outer terminals 106 and the inner row having the inner terminals 108. The outer terminals 106 and the inner terminals 108 are in a staggered configuration.

The non-leaded integrated circuit package system 400 also includes first fused leads 404, such as two of the inner terminals 108 depopulated and fused, providing ground bonding pads for an integrated circuit die (not shown) attached to the die paddle 102. The first fused leads 404 surround the inner terminals 108 not fused as well as surrounded by the inner terminals 108 not fused. The first fused leads 404 are formed along the first side 112, the second side 114, the third side 116, and the fourth side 118. For illustrative purpose, the first fused leads 404 are shown as depopulating two of the inner terminals 108, although it is understood the number of the inner terminals 108 depopulated may differ, as well.

The first fused leads 404 provide additional flexibility for ground traces (not shown) of a printed circuit board (not shown) to provide ground connection to the non-leaded integrated circuit package system 400 reducing the routing congestion of the printed circuit board. The additional routing flexibility alleviates the need to use a larger pin count, larger footprint package allowing the non-leaded integrated circuit package system 400 to be as small a footprint as possible.

Each of the first fused leads 404 have one of the paddle interconnects 402 connecting the first fused leads 404 to the die paddle 102. The paddle interconnects 402 provide additional routing flexibility for the printed circuit board design by providing the option for ground to be connected to the die paddle 102 for the ground connection to the first fused leads 404. The paddle interconnects 402 also enable a smaller package footprint.

The encapsulant 122 surrounds the die paddle 102, the tie bars 104, the outer terminals 106, the inner terminals 108, the first fused leads 404, and the paddle interconnects 402. The outer terminals 106 and the inner terminals 108 are exposed for connections to the next system level (not shown), such as the printed circuit board. The die paddle 102 may be exposed for connection to the next system level. The first fused leads 404 may be exposed for connections to the next system level. The paddle interconnects 402 may be exposed for connections to the next system level.

Figure 5:
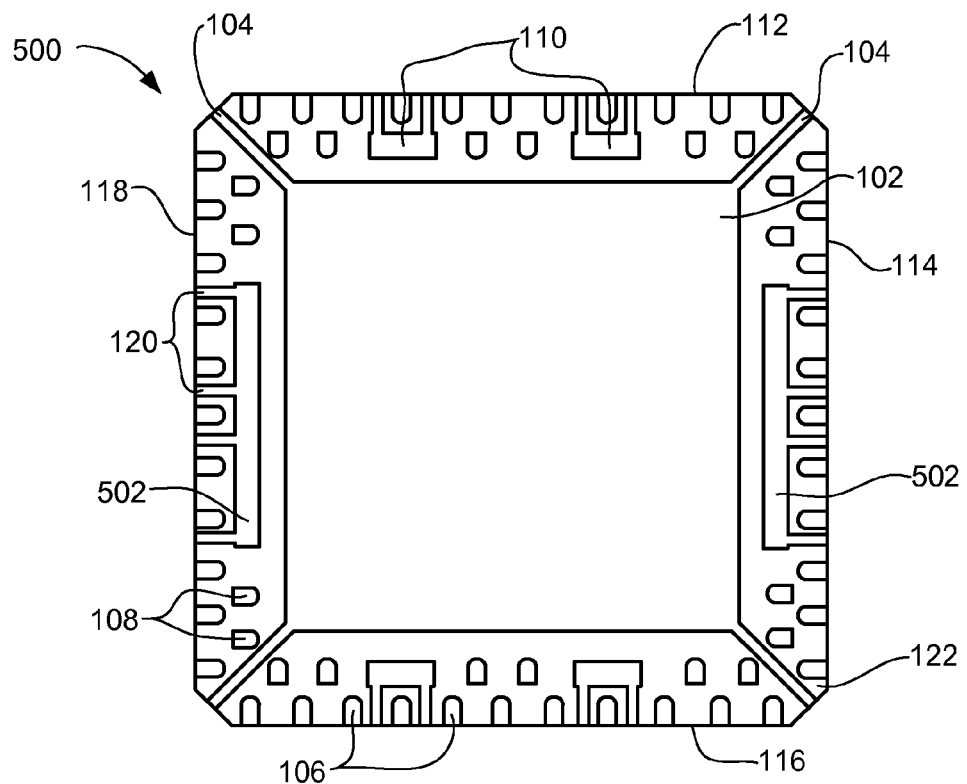
FIG. 5 is a plan view of a non-leaded integrated circuit package system in yet another alternative embodiment of the present invention.

Referring now to FIG. 5, therein is shown a plan view of a non-leaded integrated circuit package system 500 in yet another alternative embodiment of the present invention. The non-leaded integrated circuit package system 500 includes the die paddle 102 connected to the tie bars 104, and the first fused leads 110 having the extensions 120. The first fused leads 110 and the extensions 120 connected to the first fused leads 110 are on the first side 112 and the third side 116.

The non-leaded integrated circuit package system 500 also includes second fused leads 502, such as six of the inner terminals 108 depopulated and fused, and the extensions 120 extending from the second fused leads 502. The extensions 120 connected to the second fused leads 502 surround one and two of the outer terminals 106. The second fused leads 502 and the extensions 120 connected to the second fused leads 502 are on the second side 114 and the fourth side 118. The encapsulant 122 surrounds the die paddle 102, the tie bars 104, the outer terminals 106, the inner terminals 108, the first fused leads 110, the second fused leads 502, and the extensions 120.

For illustrative purpose, the extensions 120 are shown as surround one or two of the outer terminals 106, although it is understood that the extensions may surround any number of the outer terminals 106 or one of the extensions 120 may be used, as well. Also for illustrative purpose, the second fused leads 502 are shown as depopulating six of the inner terminals 108, although it is understood the number of the inner terminals 108 depopulated may differ, as well.

Figure 6:
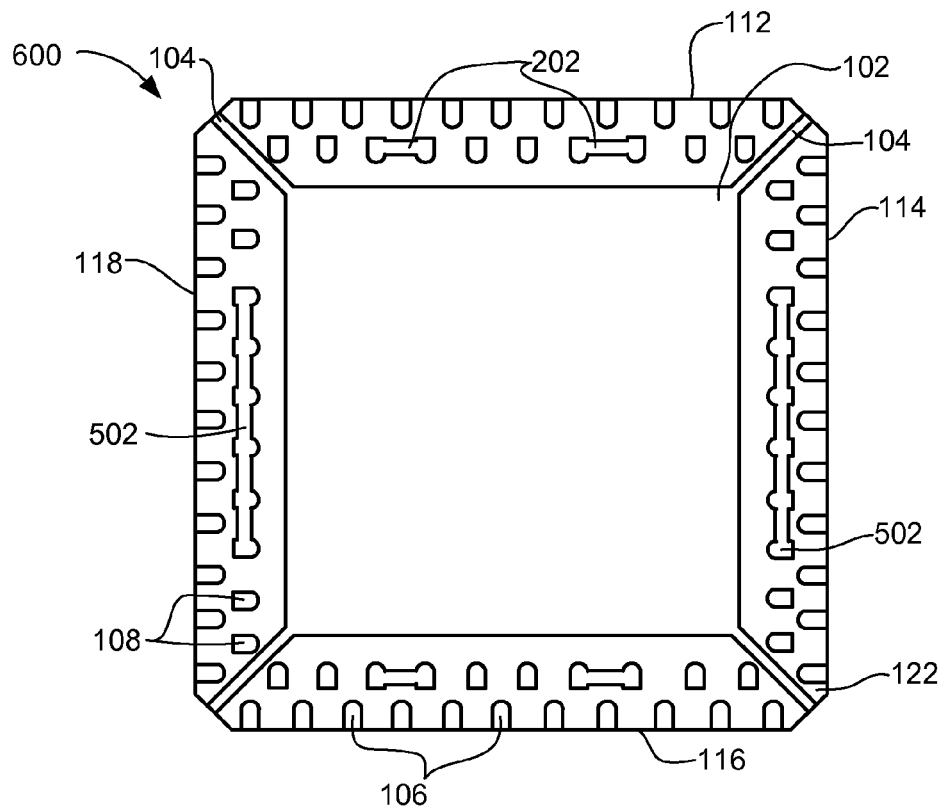
FIG. 6 is a plan view of a non-leaded integrated circuit package system in yet another alternative embodiment of the present invention.

Referring now to FIG. 6, therein is shown a plan view of a non-leaded integrated circuit package system 600 in yet another alternative embodiment of the present invention. The non-leaded integrated circuit package system 600 includes the die paddle 102 connected to the tie bars 104, the first fused leads 202, and the second fused leads 502. The first fused leads 202 are on the first side 112 and the third side 116. The second fused leads 502 are on the second side 114 and the fourth side 118. The encapsulant 122 surrounds the die paddle 102, the tie bars 104, the outer terminals 106, the inner terminals 108, the first fused leads 202, and the second fused leads 502.

Figure 7:
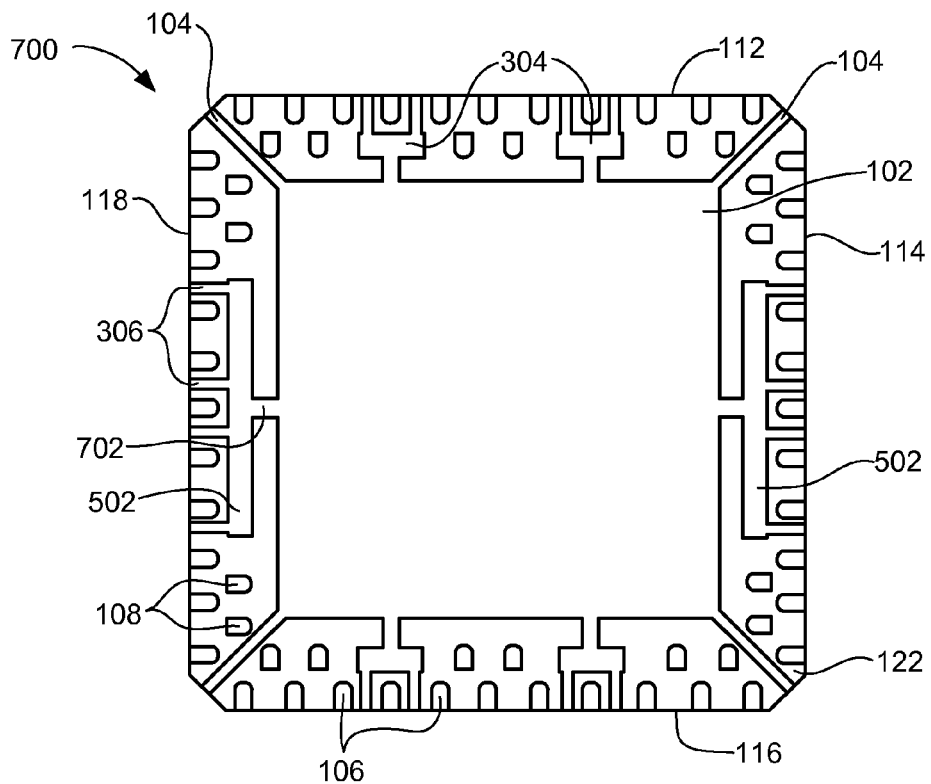
FIG. 7 is a plan view of a non-leaded integrated circuit package system in yet another alternative embodiment of the present invention.

Referring now to FIG. 7, therein is shown a plan view of a non-leaded integrated circuit package system 700 in yet another alternative embodiment of the present invention. The non-leaded integrated circuit package system 700 includes the die paddle 102 connected to the tie bars 104 and the first fused leads 304 having the extensions 306. The first fused leads 304 and the extensions 306 connected to the first fused leads 304 are on the first side 112 and the third side 116. The second fused leads 502 and the extensions 306 connected to the second fused leads 502 are on the second side 114 and the fourth side 118. Paddle interconnects 702 connect the first fused leads 304 and the second fused leads 502 to the die paddle 102. The encapsulant 122 surrounds the die paddle 102, the tie bars 104, the outer terminals 106, the inner terminals 108, the first fused leads 304, the second fused leads 502, the extensions 306, and the paddle interconnects 702.

Figure 8:
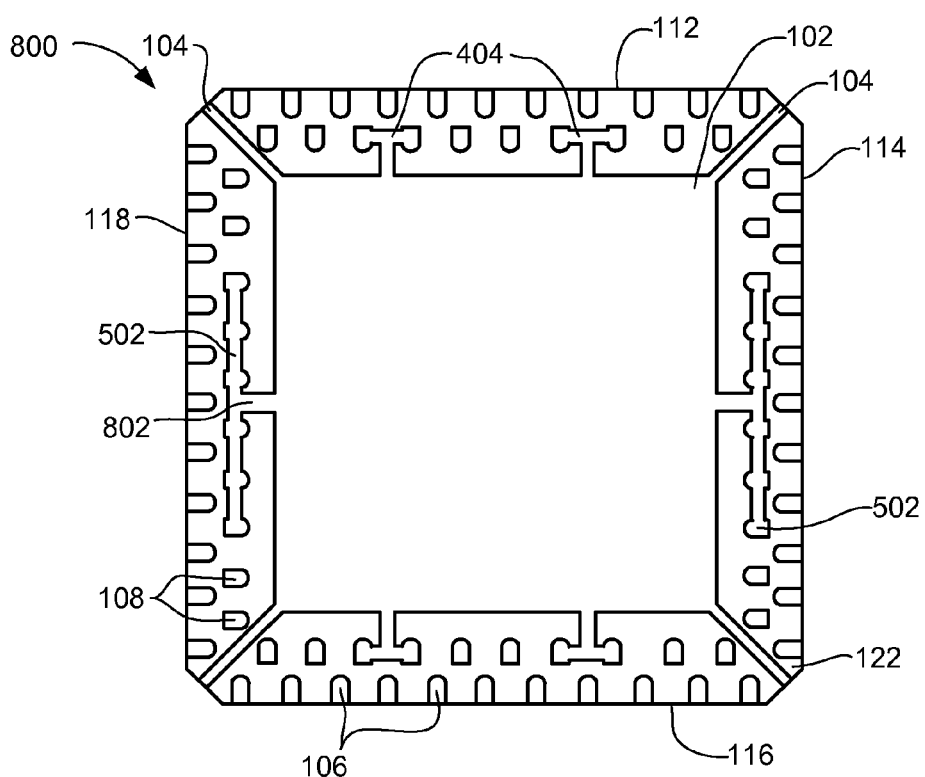
FIG. 8 is a plan view of a non-leaded integrated circuit package system in yet another alternative embodiment of the present invention.

Referring now to FIG. 8, therein is shown a plan view of a non-leaded integrated circuit package system 800 in yet another alternative embodiment of the present invention. The non-leaded integrated circuit package system 800 includes the die paddle 102 connected to the tie bars 104, and the first fused leads 404. The first fused leads 404 are on the first side 112 and the third side 116. The second fused leads 502 are on the second side 114 and the fourth side 118. Paddle interconnects 802 connect the first fused leads 404 and the second fused leads 502 to the die paddle 102. The encapsulant 122 surrounds the die paddle 102, the tie bars 104, the outer terminals 106, the inner terminals 108, the first fused leads 404, the second fused leads 502, and the paddle interconnects 802.

Figure 9:
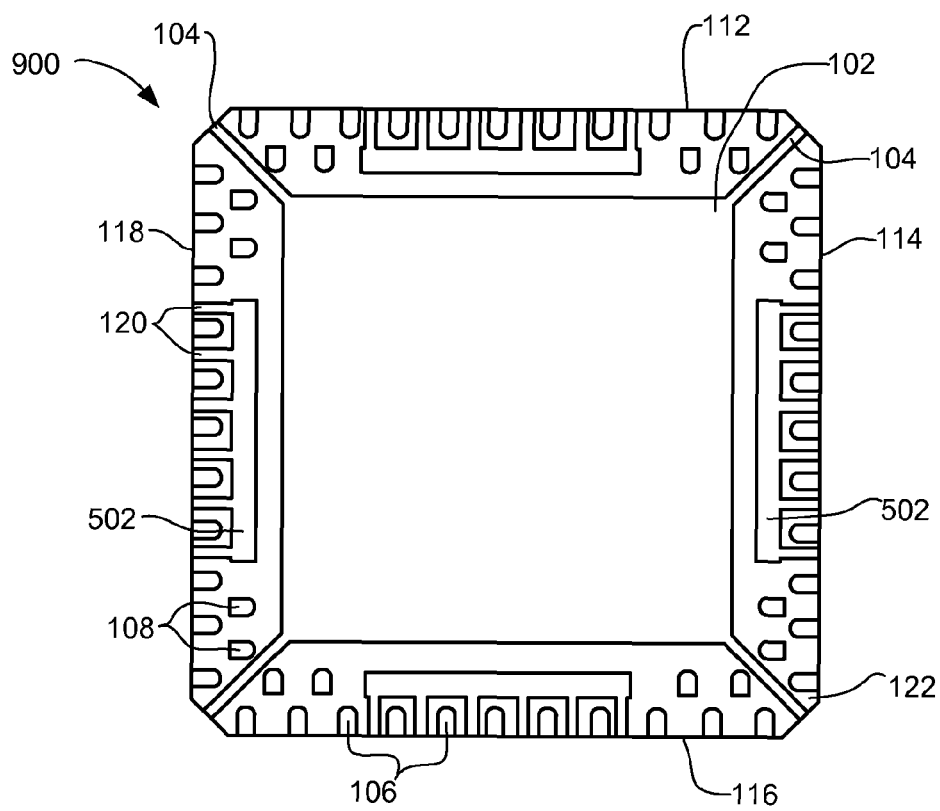
FIG. 9 is a plan view of a non-leaded integrated circuit package system in yet another alternative embodiment of the present invention.

Referring now to FIG. 9, therein is shown a plan view of a non-leaded integrated circuit package system 900 in yet another alternative embodiment of the present invention. The non-leaded integrated circuit package system 900 includes the die paddle 102 connected to the tie bars 104, and the second fused leads 502 having the extensions 120. The second fused leads 502 and the extensions 120 connected to the second fused leads 502 are on the first side 112, the second side 114, the third side 116 and the fourth side 118. The encapsulant 122 surrounds the die paddle 102, the tie bars 104, the outer terminals 106, the inner terminals 108, the second fused leads 502, and the extensions 120.

Figure 10:
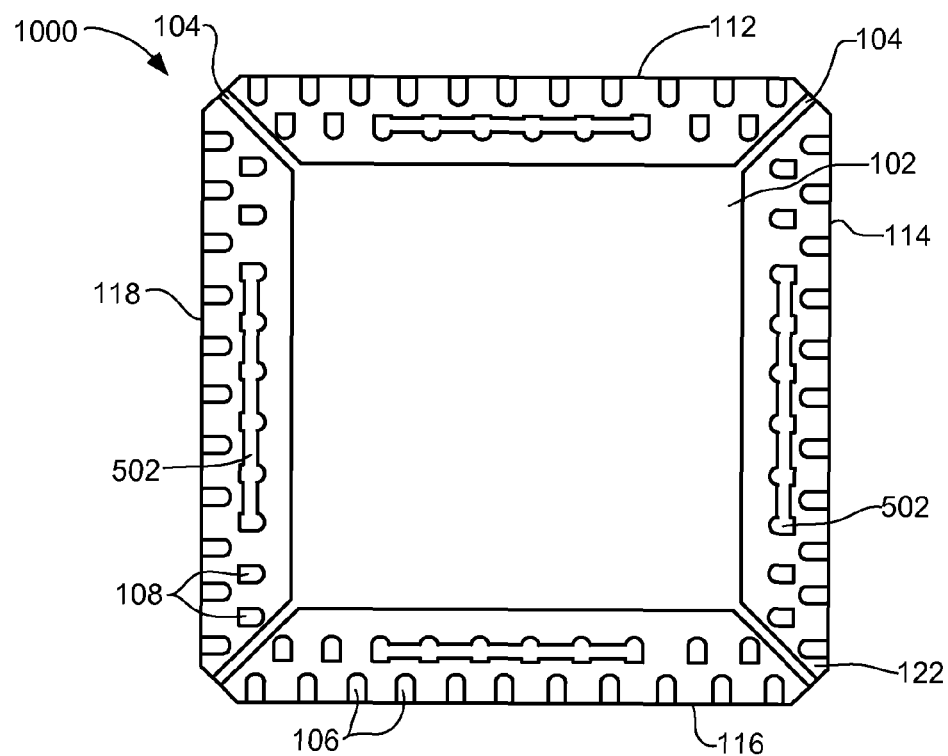
FIG. 10 is a plan view of a non-leaded integrated circuit package system in yet another alternative embodiment of the present invention.

Referring now to FIG. 10, therein is shown a plan view of a non-leaded integrated circuit package system 1000 in yet another alternative embodiment of the present invention. The non-leaded integrated circuit package system 1000 includes the die paddle 102 connected to the tie bars 104, and the second fused leads 502. The second fused leads 502 are on the first side 112, the second side 114, the third side 116 and the fourth side 118. The encapsulant 122 surrounds the die paddle 102, the tie bars 104, the outer terminals 106, the inner terminals 108, and the second fused leads 502.

Figure 11:
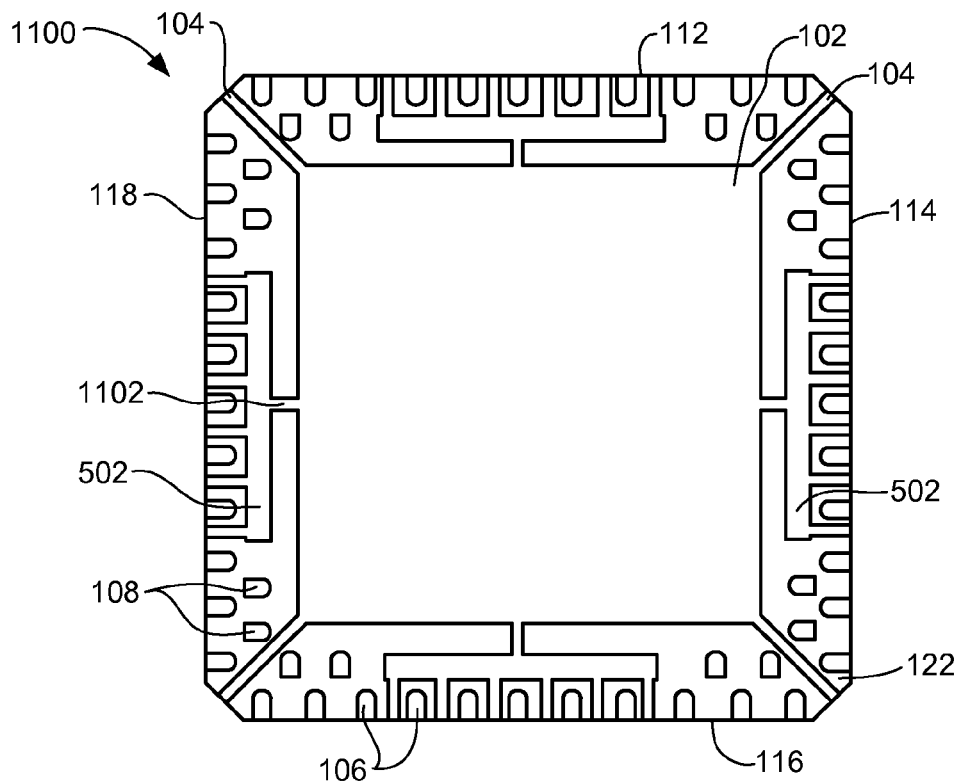
FIG. 11 is a plan view of a non-leaded integrated circuit package system in yet another alternative embodiment of the present invention.

Referring now to FIG. 11, therein is shown a plan view of a non-leaded integrated circuit package system 1100 in yet another alternative embodiment of the present invention. The non-leaded integrated circuit package system 1100 includes the die paddle 102 connected to the tie bars 104, and the second fused leads 502 having the extensions 120. The second fused leads 502 and the extensions 120 connected to the second fused leads 502 are on the first side 112, the second side 114, the third side 116 and the fourth side 118. Paddle interconnects 1102 connect the second fused leads 502 to the die paddle 102. The encapsulant 122 surrounds the die paddle 102, the tie bars 104, the outer terminals 106, the inner terminals 108, the second fused leads 502, the extensions 120, and the paddle interconnects 1102.

Figure 12:
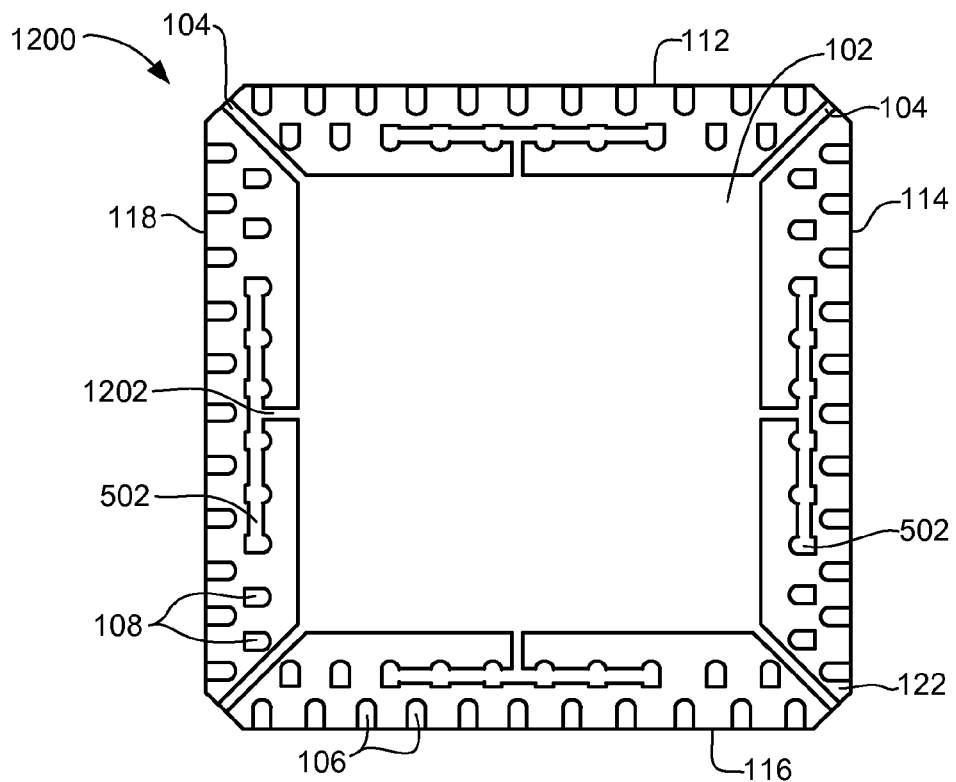
FIG. 12 is a plan view of a non-leaded integrated circuit package system in yet another alternative embodiment of the present invention.

Referring now to FIG. 12, therein is shown a plan view of a non-leaded integrated circuit package system 1200 in yet another alternative embodiment of the present invention. The non-leaded integrated circuit package system 1200 includes the die paddle 102 connected to the tie bars 104, and the second fused leads 502. The second fused leads 502 are on the first side 112, the second side 114, the third side 116 and the fourth side 118. Paddle interconnects 1202 connect the second fused leads 502 to the die paddle 102. The encapsulant 122 surrounds the die paddle 102, the tie bars 104, the outer terminals 106, the inner terminals 108, the second fused leads 502, and the paddle interconnects 1202.

Figure 13:
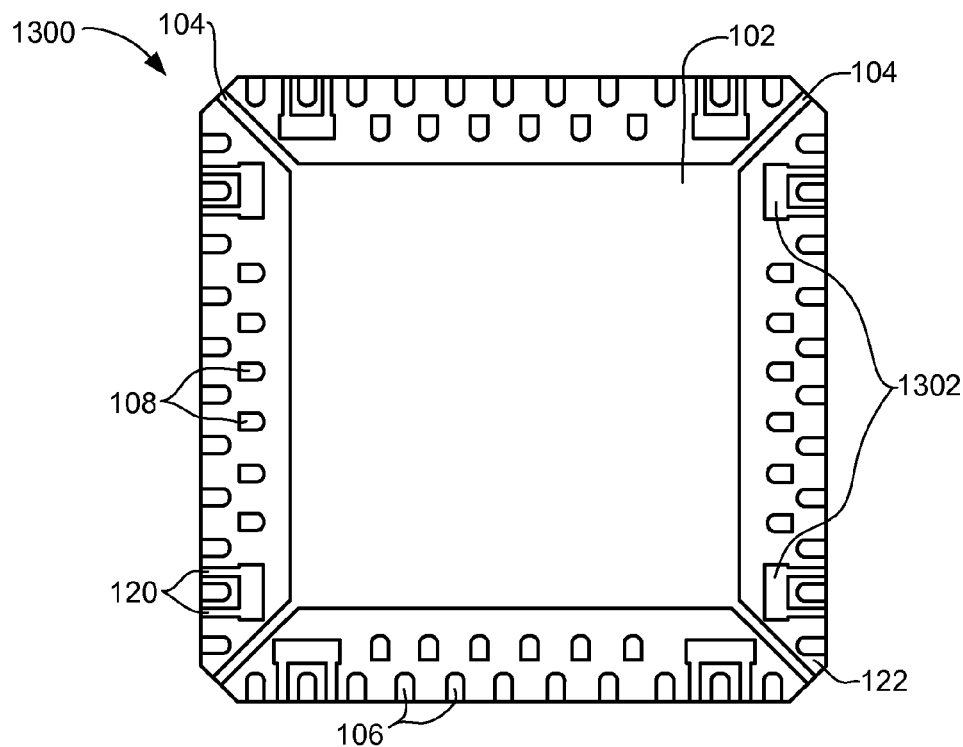
FIG. 13 is a plan view of a non-leaded integrated circuit package system in yet another alternative embodiment of the present invention.

Referring now to FIG. 13, therein is shown a plan view of a non-leaded integrated circuit package system 1300 in yet another alternative embodiment of the present invention. The non-leaded integrated circuit package system 1300 includes the die paddle 102 connected to the tie bars 104, and third fused leads 1302, such as two of the inner terminals 108 closest to and adjacent to the tie bars 104. The extensions 120 extend from the third fused leads 1302 to the edges of the non-leaded integrated circuit package system 1300 and surround one of the outer terminals 106. The encapsulant 122 surrounds the die paddle 102, the tie bars 104, the outer terminals 106, the inner terminals 108, the third fused leads 1302, and the extensions 120. For illustrative purpose, the third fused leads 1302 is shown as two of the inner terminals 108 depopulated and fused, although it is understood that the number of the inner terminals 108 depopulated and fused may differ, as well.

Figure 14:
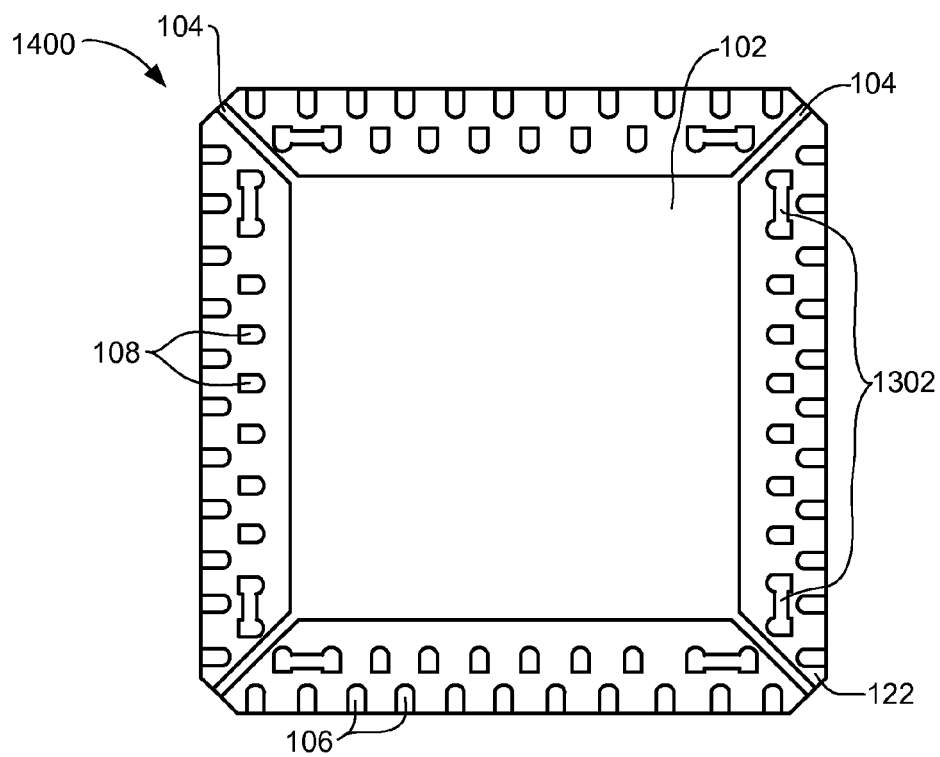
FIG. 14 is a plan view of a non-leaded integrated circuit package system in yet another alternative embodiment of the present invention.

Referring now to FIG. 14, therein is shown a plan view of a non-leaded integrated circuit package system 1400 in yet another alternative embodiment of the present invention. The non-leaded integrated circuit package system 1400 includes the die paddle 102 connected to the tie bars 104, and the third fused leads 1302, such as two of the inner terminals 108 closest to the tie bars 104. The encapsulant 122 surrounds the die paddle 102, the tie bars 104, the outer terminals 106, the inner terminals 108, and the third fused leads 1302.

Figure 15:
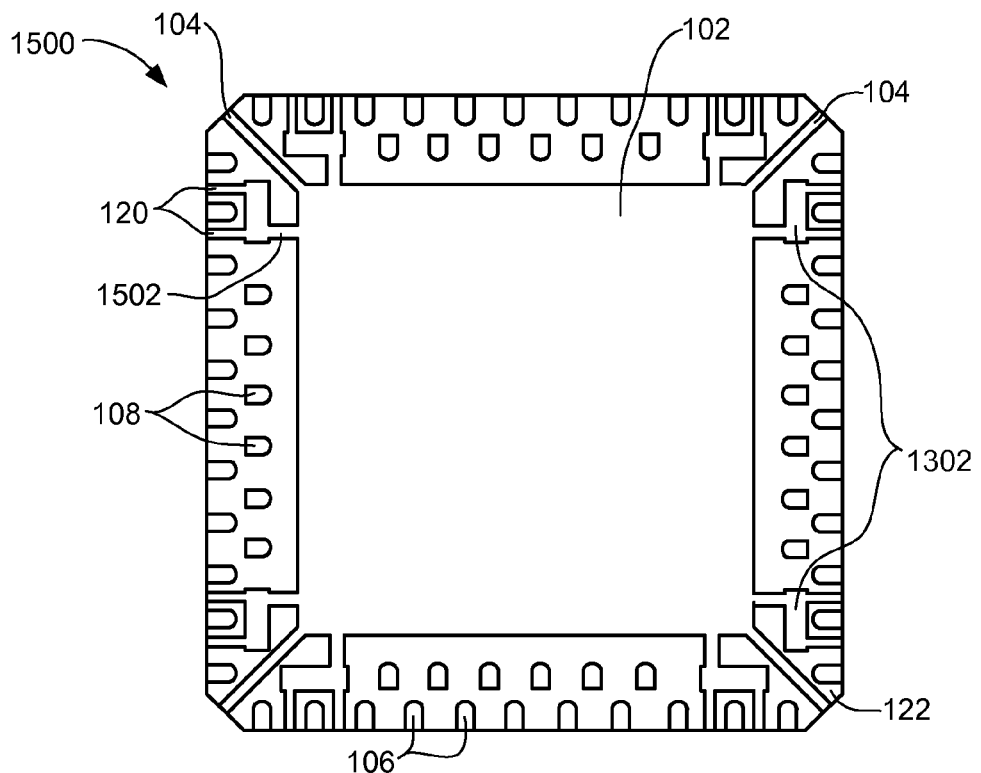
FIG. 15 is a plan view of a non-leaded integrated circuit package system in yet another alternative embodiment of the present invention.

Referring now to FIG. 15, therein is shown a plan view of a non-leaded integrated circuit package system 1500 in yet another alternative embodiment of the present invention. The non-leaded integrated circuit package system 1500 includes the die paddle 102 connected to the tie bars 104, and the third fused leads 1302, such as two of the inner terminals 108 closest to the tie bars 104. The extensions 120 extend from the third fused leads 1302 to the edges of the non-leaded integrated circuit package system 1500 and surround one of the outer terminals 106. Paddle interconnects 1502 connect each of the third fused leads 1302 and the die paddle 102. The encapsulant 122 surrounds the die paddle 102, the tie bars 104, the outer terminals 106, the inner terminals 108, the third fused leads 1302, the extensions 120, and the paddle interconnects 1502.

Figure 16:
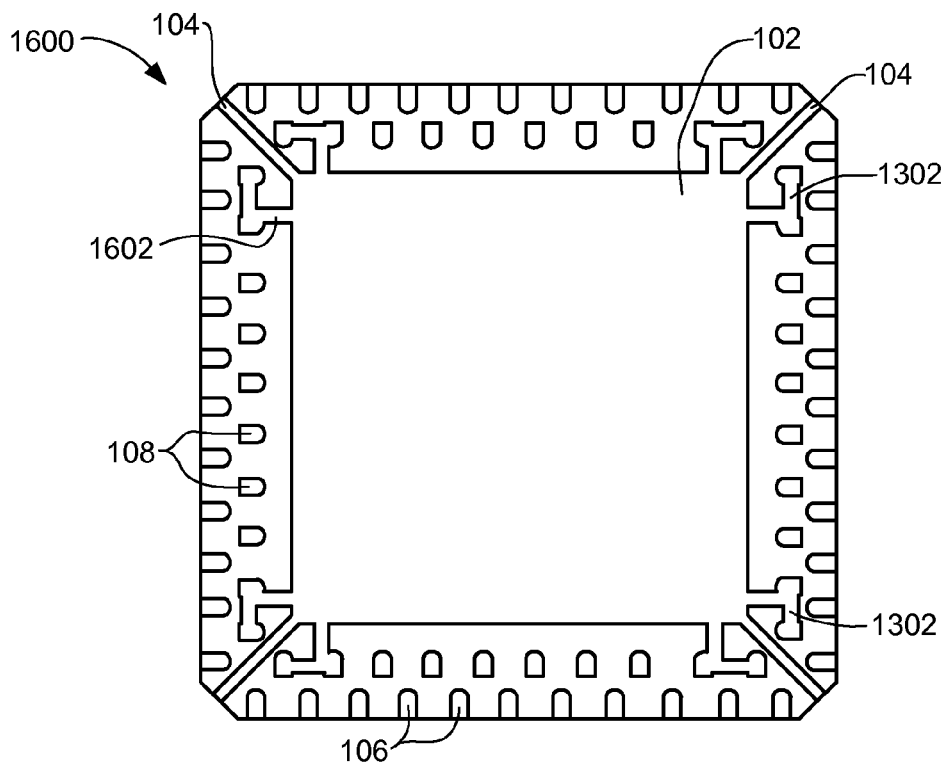
FIG. 16 is a plan view of a non-leaded integrated circuit package system in yet another alternative embodiment of the present invention.

Referring now to FIG. 16, therein is shown a plan view of a non-leaded integrated circuit package system 1600 in yet another alternative embodiment of the present invention. The non-leaded integrated circuit package system 1600 includes the die paddle 102 connected to the tie bars 104, and the third fused leads 1302, such as two of the inner terminals 108 closest to the tie bars 104. Paddle interconnects 1602 connect each of the third fused leads 1302 and the die paddle 102. The encapsulant 122 surrounds the die paddle 102, the tie bars 104, the outer terminals 106, the inner terminals 108, the third fused leads 1302, and the paddle interconnects 1602.

Figure 17:
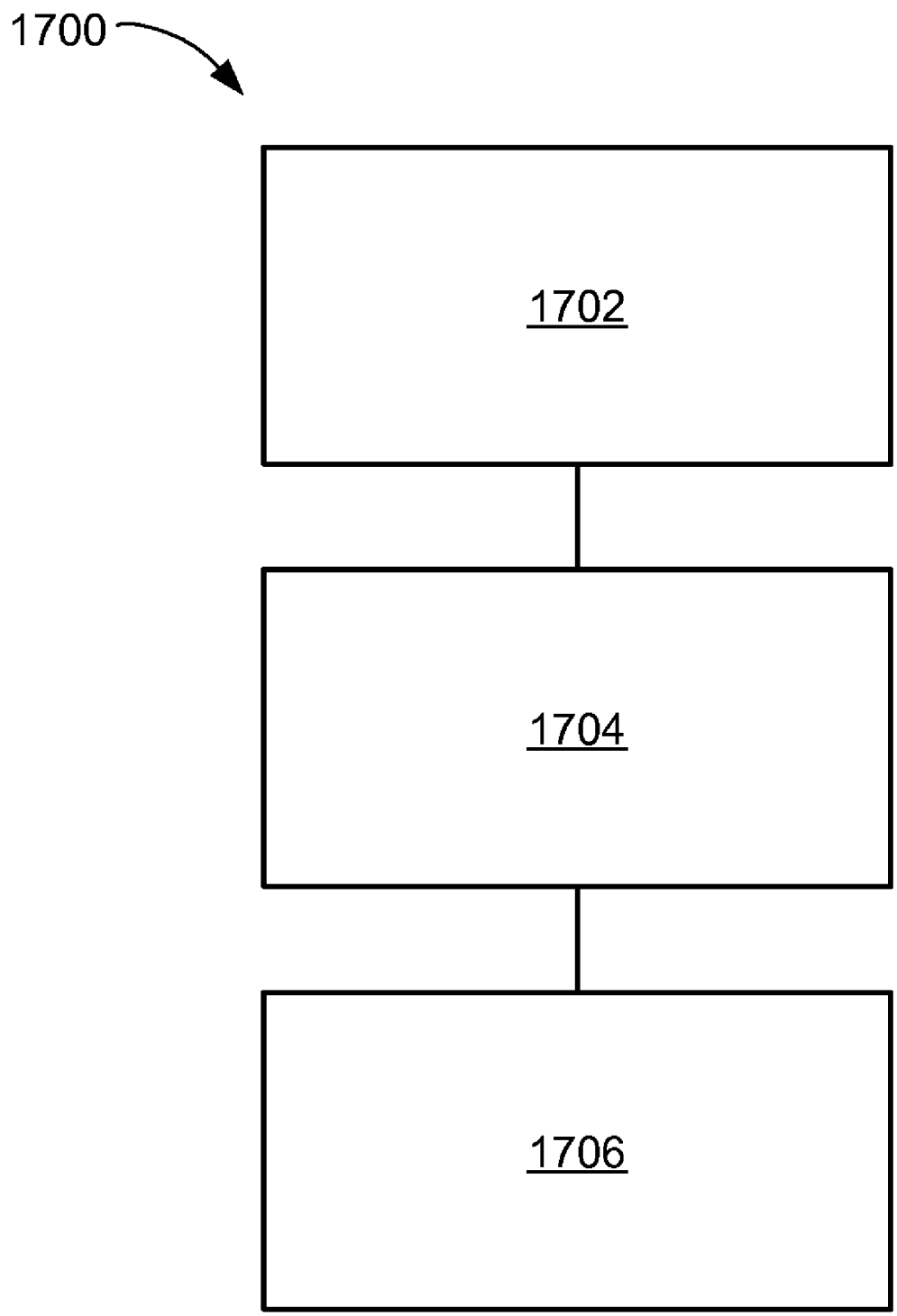
FIG. 17 is a flow chart of a non-leaded integrated circuit package system for manufacturing the non-leaded integrated circuit package system in an embodiment of the present invention.

Referring now to FIG. 17, therein is shown a flow chart of a non-leaded integrated circuit package system 1700 for manufacturing the non-leaded integrated circuit package system 100 in an embodiment of the present invention. The system 1700 includes providing a die paddle of a lead frame in a block 1702; forming a dual row of terminals including an outer terminal and an inner terminal in a block 1704; and selectively fusing an inner terminal and an adjacent inner terminal to form a fused lead in a block 1706.

It has been discovered that the present invention thus has numerous aspects.

It has been discovered that the selectively forming fused leads from the inner terminals, the extensions from the fused leads, and paddle interconnects to the die paddle simplifies the design and improves manufacturing yield of the non-leaded integrated circuit package system. The design simplification and yield improvement also occurs to the printed circuit board that the non-leaded integrated circuit package system is mounted thereon.

An aspect is that the present invention provides variable and selectable fused leads of the inner terminals as required through the use of a number of processes, such as fusing and half etching. These processes may be used to customize a common non-leaded integrated circuit package to the required configuration per the integrated circuit die. The fused leads provide additional bonding sites for the integrated circuit die to connect to ground. The additional bonding sites may potentially provide shorter bond length for the bond wires as well as alleviate congestions to bond the integrated circuit die to the outer and inner terminal pads, potentially resulting in an improved manufacturing yield of the non-leaded integrated circuit package system.

Another aspect is that the present invention provides variable and selectable extensions from the fused leads to the edges of the package as required through the use of a number of processes, such as fusing and half etching. These processes may be used to customize a common non-leaded integrated circuit package to the required configuration per the integrated circuit die. The extensions provide additional ground connection sites for the printed circuit board to the integrated circuit die.

Yet another aspect is that the present invention provides variable and selectable paddle interconnects from the fused leads to the die paddle as required through the use of a number of processes, such as fusing and half etching. These processes may be used to customize a common non-leaded integrated circuit package to the required configuration per the integrated circuit die. The paddle interconnects provide additional ground connection sites for the printed circuit board to the integrated circuit die.

Yet another aspect of the present invention is the fused leads, extensions, paddle interconnects not only provide additional bonding sites for the integrated circuit die, they also provide additional connection sites for the printed circuit board design. Ground connections from the printed circuit board to the non-leaded integrated circuit package system may be formed by connecting to the die paddle, any one of the fused leads, the paddle interconnects, the extensions, the terminal pads, or a combination thereof. This connection flexibility provides an additional degree of freedom to minimize congestion of the printed circuit board, potentially resulting in an improved manufacturing yield, thermal dissipation, and electrical performance of the printed circuit board.

Yet another aspect of the present invention is that multiple ground planes may be provided while minimizing the printed circuit board congestion. The die paddle, the fused leads, the paddle interconnects, and the extensions may be connected to a particular ground plane, such as digital ground, of the printed circuit board. However, other ground planes, such as analog ground, may be connected to the terminals, as required.

Thus, it has been discovered that the non-leaded integrated circuit package system method of the present invention furnishes important and heretofore unknown and unavailable solutions, capabilities, and functional aspects for increasing input and output density in systems. The resulting processes and configurations are straightforward, cost-effective, uncomplicated, highly versatile and effective, can be implemented by adapting known technologies, and are thus readily suited for efficiently and economically manufacturing non-leaded integrated circuit packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:

1. A method of manufacture of a non-leaded integrated circuit package system comprising:

providing a die paddle of a lead frame;

forming a dual row of terminals of the lead frame including a staggered configuration of an outer terminal in an outer row and an inner terminal in an inner row; and providing the inner terminal and an adjacent inner terminal to form a fused lead depopulating the inner terminal and the adjacent inner terminal, the fused lead isolated from another inner terminal in the inner row.

2. The method as claimed in claim 1 further comprising encapsulating the die paddle, the fused lead, the outer terminal, and the another inner terminal.

3. The method as claimed in claim 1 wherein providing the inner terminal and the adjacent inner terminal to form the fused lead comprises forming a ground bond site for an integrated circuit die.

4. The method as claimed in claim 1 wherein providing the inner terminal and adjacent inner terminal to form the fused lead comprises providing a ground plane with the fused lead and providing another ground plane with the outer terminal and the another inner terminal.

5. A method of manufacture of a non-leaded integrated circuit package system comprising:

providing a die paddle of a lead frame;

forming a dual row of terminals including an outer terminal in an outer row and an inner terminal in an inner row; and providing an inner terminal and an adjacent inner terminal to form a fused lead isolated from another inner terminal in the inner row.

6. The method as claimed in claim 5 further comprising forming an extension from the fused lead to an edge of the dual row of terminals and next to the outer terminal.

7. The method as claimed in claim 5 further comprising:

forming an extension from the fused lead to an edge of the dual row of terminals and next to the outer terminal; and forming a paddle interconnect between the fused lead and the die paddle.

8. The method as claimed in claim 5 wherein providing the inner terminal and the adjacent inner terminal to form the fused lead comprises fusing the inner terminal adjacent to a tie bar and the adjacent inner terminal to form the fused lead.

9. The method as claimed in claim 5 wherein providing the inner terminal and the adjacent inner terminal to form the fused lead comprises:
- forming a first fused lead along a first side and a third side; and
- forming a second fused lead along a second side and a fourth side.

10. The method as claimed in claim 1 wherein providing the inner terminal and the adjacent inner terminal to form the fused lead comprises forming a ground shield with the fused lead for another inner terminal adjacent to the fused lead.

* * * * *